United States Patent
Colpo et al.

(10) Patent No.: US 7,618,686 B2
(45) Date of Patent: Nov. 17, 2009

(54) METHOD AND APPARATUS FOR SEQUENTIAL PLASMA TREATMENT

(75) Inventors: Pascal Colpo, Annecy (FR); Francois Rossi, Bi Andronno (IT)

(73) Assignee: European Community (EC), Brussels (BE)

( * ) Notice: Subject to any disclaimer, the term of this patent is extended or adjusted under 35 U.S.C. 154(b) by 714 days.

(21) Appl. No.: 10/475,512

(22) PCT Filed: Apr. 24, 2002

(86) PCT No.: PCT/EP02/04583

§ 371 (c)(1),
(2), (4) Date: Mar. 25, 2004

(87) PCT Pub. No.: WO02/088420

PCT Pub. Date: Nov. 7, 2002

(65) Prior Publication Data

US 2004/0154541 A1    Aug. 12, 2004

(30) Foreign Application Priority Data

Apr. 27, 2001    (EP) ................... 01401101

(51) Int. Cl.
*H05H 1/46* (2006.01)
*B05D 3/06* (2006.01)
*C23C 16/505* (2006.01)
*C23C 16/507* (2006.01)
*C23C 16/515* (2006.01)
*C23C 16/52* (2006.01)

(52) U.S. Cl. .................. 427/535; 427/569; 427/570; 427/536; 216/71; 118/723 E; 118/723 MP

(58) Field of Classification Search .............. None
See application file for complete search history.

(56) References Cited

U.S. PATENT DOCUMENTS

| | | | | |
|---|---|---|---|---|
| 4,349,373 A | * | 9/1982 | Sterling et al. | ............... 65/60.8 |
| 4,692,347 A | | 9/1987 | Yasuda et al. | |
| 4,824,690 A | * | 4/1989 | Heinecke et al. | ............ 427/577 |
| 5,514,276 A | | 5/1996 | Babcock et al. | |
| 5,521,351 A | * | 5/1996 | Mahoney | ............... 219/121.59 |
| 5,653,811 A | * | 8/1997 | Chan | ....................... 118/723 I |

(Continued)

FOREIGN PATENT DOCUMENTS

DE    40 34 211    11/1991

(Continued)

OTHER PUBLICATIONS

Translation of JP 11-256331 (see above).*

(Continued)

*Primary Examiner*—Marianne L Padgett
(74) *Attorney, Agent, or Firm*—Oblon, Spivak, McClelland, Maier & Neustadt, L.L.P.

(57) ABSTRACT

An apparatus for plasma treatment of a non-conductive hollow substrate, including a plurality of ionization energy sources disposed adjacent to each other all along the part of the substrate to be treated. The apparatus also includes a processor to sequentially power the plurality of ionization energy sources from a radio frequency power source. Each ionization energy source includes two parts sandwiching the substrate. The ionization energy sources can be capacitively or inductively coupled plasma sources.

20 Claims, 4 Drawing Sheets

U.S. PATENT DOCUMENTS

| | | | |
|---|---|---|---|
| 5,690,745 A * | 11/1997 | Grunwald et al. | 118/723 MW |
| 5,907,221 A * | 5/1999 | Sato et al. | 315/111.51 |
| 5,985,378 A | 11/1999 | Paquet | |
| 6,022,602 A * | 2/2000 | Nomura | 428/36.8 |
| 6,051,073 A * | 4/2000 | Chu et al. | 438/766 |
| 6,177,148 B1 | 1/2001 | Walther et al. | |
| 6,294,226 B1 * | 9/2001 | Shimamura | 427/577 |
| 6,338,313 B1 * | 1/2002 | Chan | 118/723 I |
| 6,649,223 B2 * | 11/2003 | Rossi et al. | 427/569 |
| 6,682,630 B1 * | 1/2004 | Colpo et al. | 156/345.48 |

FOREIGN PATENT DOCUMENTS

| | | | |
|---|---|---|---|
| EP | 0 370 701 | | 5/1990 |
| EP | 0 953 428 | | 11/1999 |
| JP | 226884 | * | 8/1998 |
| JP | 11-256331 | * | 9/1999 |

OTHER PUBLICATIONS

Translation of JP 10-226884 (see above).*

* cited by examiner

METHOD AND APPARATUS FOR SEQUENTIAL PLASMA TREATMENT

FIELD OF THE INVENTION

The present invention relates to a method and an apparatus for substrate treatments using plasma such as, for example, polymer treatment for biomedical devices or food and pharmaceutical packaging devices. In particular, the present invention relates to plasma treatment or deposition in non conductive hollow substrates having large aspect ratio such as small diameter tubes, flat boxes.

BACKGROUND OF THE INVENTION

Hollow substrates with a large aspect ratio are commonly used in various technological fields such as catheters or endoscopes for medical materials and packaging for food or pharmaceutical applications. The expression "large aspect ratio" means that the hollow substrate has at least one dimension that is much larger than another one, and more particularly that the length of the substrate is much larger than a dimension of the substrate aperture. FIG. 4 shows two examples of hollow substrates which have a large aspect ratio L/a, where L is the length of the substrate and a is the smallest dimension of the substrate aperture. A tube 1 comprises an inner cavity having a large length L with respect to the diameter a of the tube. Large aspect ratio substrates may also have a form of a flat box 101 which exhibits a little aperture height a in comparison with its length L.

A general difficulty of the use of plasma treatment is the complexity to treat internal walls of such substrates. Indeed, plasma treatment of this kind of substrate is difficult to perform since the plasma creation into large aspect ratio hollow substrates generally presents a lack of plasma uniformity and thus of treatment. A uniform treatment is ensured only if, for the whole substrate length, the gas precursor concentration, the local plasma density and the pressure are rigorously constant.

The creation of the plasma inside the substrate is carried out by applying electrical energy to the process gas. The electrons are accelerated by an electric field and ions are created from inelastic collisions between gas molecules and the accelerated electrons. The electrical energy to accelerate electrons in the gas is generally performed by a varying electric field, a varying magnetic field, or both.

Two main problems occur when the aim is to treat or to deposit plasma along a hollow substrate. The first problem concerns the difficulty to create a uniform plasma density along the substrate length. Indeed, to achieve this condition, a constant electrical energy must be applied to the substrate, which becomes less feasible over a certain size.

The second problem is that uniformity of treatment along the whole length can be ensured only if a constant quantity of precursor reacts all along the substrate length. Even if a special energy source arrangement can be implemented to create uniform plasma density along the substrate length, the precursor concentration will decrease irremediably as soon as the gas precursor has flowed the substrate, since higher precursor consumption will occur at the substrate gas inlet.

To remedy this problem, several solutions have been developed. One of them, described in U.S. Pat. No. 4,692,347 and illustrated in FIG. 5, consists of shifting a tube 502 to be treated with respect to a fixed plasma source 505 in a vacuum chamber 501. The tube 502 to be coated is initially wound on a reel 508 with an extremity in communication with a monomer source 503 via a flow controller 504. The plasma is created inside the tube 502 by continuously passing the tube in a glow discharge zone formed by the fixed reactance coupling source 505 formed from two electrodes radio frequency powered. The tube part whose interior wall has been coated is wound on a receiving reel 509. A low absolute pressure is maintained inside the tube by evacuating means 506 and 507 connected to the other extremity of the tube.

However, such a solution has drawbacks. To roll and unroll thin tubes of low or high stiffness can lead to local shrinking or folding, that is to say irreversible tube deformations. Moreover, the structure and implementation of the evacuating means are complex and it is difficult to guarantee a good pressure control along the tube. These difficulties affect not only the reliability of the plasma treatment of a tube but also the costs and the rapidity of the treatment.

Conversely, another solution is to attach the plasma source to a motion mechanism for shifting the plasma source with respect to the tube to be treated. However, such a mechanism is complex and does not permit to control the parameters for a plasma uniform treatment in the substrate. The velocity and the precision of the plasma source motion required for uniform plasma treatment leads to develop electronic control system sensibly increasing the cost of the treatment. Moreover, such a device is limited to single tube treatment.

OBJECT AND SUMMARY OF THE INVENTION

In view of such aspects, an object of the present invention is to provide a method and an apparatus in which the above-mentioned problems can be solved. In other words, an object is to provide a method and an apparatus which allow a plasma treatment of hollow substrates in uniform way all-over the inside parts of the substrates.

To this end, there is provided a method for plasma treatment of a hollow substrate, characterised by comprising the steps of placing a plurality of ionisation energy sources all along the part of the substrate to be treated, injecting a process gas inside the substrate, the gas containing a precursor for plasma creation, maintaining a pressure inside the tube within a predetermined range, and powering the plurality of ionisation energy sources, in sequence, for selectively creating plasma inside the substrate at a location corresponding to the respective source powered, the step of injecting the process gas is repeated at least before the powering of each ionisation energy source.

Thus according to the present invention, uniform plasma density can be created along the substrate while having a constant gas concentration reacting along the tube.

According to an aspect of the present invention, the plurality of ionisation energy sources are either capacitively coupled plasma sources or inductively coupled plasma sources.

The plurality of ionisation energy sources may be powered by a common radio frequency power source or by a separate radio frequency power source for each ionisation energy sources.

According to another aspect of the invention, the ionisation energy sources are powered in a pulsed fashion.

The step of injecting a process gas inside the substrate can be also performed in a pulsed fashion. Although the process gas can be pulsed without using a pulsed ionisation energy source and conversely, according to an aspect of the present invention, the gas flow can be pulsed in accordance with the sequences of powering the ionisation energy sources. This ensures that the process gas and therefore the precursor, is renewed in front of the ionisation energy sources between each powering sequence. The precursor consumed after a sequence of powering is replaced so as to maintain a constant precursor concentration each time the plasma is created in the substrate.

According to another aspect of the invention, the process gas is permanently flowed in the substrate at a constant precursor rate. Therefore, in this case, the step of injecting the process gas inside the substrate is continuously performed during the entire plasma treatment of the substrate.

More precisely, the substrate is a hollow substrate with a large aspect ratio.

In an embodiment, the plurality of ionisation energy sources (107-112) are placed according to an array of two dimensions.

The present invention also provides an apparatus for plasma treatment of a non-conductive hollow substrate, comprising generation means for generating a plasma in the substrate, characterised in that the generation means comprise a plurality of ionisation energy sources disposed adjacent to each other all along the part of the substrate to be treated and in that said apparatus further comprises a processing means for sequentially powering the plurality of ionisation energy sources from radio frequency power supply means.

More specifically, the radio frequency power supply means comprise a single radio frequency power source for powering the plurality of ionisation energy sources or a plurality of separate radio frequency power sources for respectively powering the plurality of ionisation energy sources.

According to an aspect of the invention, the radio frequency power supply means is of a pulse generator type for powering the ionisation energy sources in a pulsed fashion. The apparatus of the present invention may also comprise a gas flow controller for controlling the kinetic of the process gas flowing into the substrate. The gas flow controller may also serve for injecting the process gas in a pulsed fashion. Although the process gas can be pulsed without using a pulsed ionisation energy source, according to an aspect of the invention, the gas flow controller can be connected to output means of the processing means in order to command the gas flow in accordance with the sequences of powering the ionisation energy sources. This ensures that the process gas and therefore the precursor is renewed in front of the ionisation energy sources between each powering sequence. The precursor consumed after a sequence of powering is replaced so as to maintain a constant precursor concentration each time the plasma is created in the substrate.

The plurality of ionisation energy sources may be capacitively coupled plasma sources or inductively coupled plasma sources.

Specifically, each ionisation energy source comprises electromagnetic means for producing through the substrate a magnetic flux perpendicular to a direction of a substrate length.

According to an embodiment of the invention, the apparatus further comprises a plasma chamber provided with two oppositely facing field admission windows and, as electromagnetic means, first and second opposite coil arrangements located on an outer surface of the first and second windows respectively, the first and second coil arrangements being connected to power supply line such that a current of a same direction flows simultaneously in the first and second coil arrangements.

The first and second coil arrangements comprises each an inductor having a serpentine form.

Advantageously, the first and second coil arrangements further comprises a magnetic core associated with the inductors of the coil arrangements, the magnetic core presenting a pole face structure adapted to be applied against or close to the field admission windows.

Typically, the radio frequency power supply means deliver power at a frequency around 10 kHz to 100 MHz, preferably at a frequency of 13.56 MHz.

According to another embodiment of the invention, the plurality of ionisation energy sources are disposed at each side of the substrate according to an array of two dimensions.

BRIEF DESCRIPTION OF THE DRAWINGS

The invention and its advantages will be better understood from the following description, given as non-limiting examples, of preferred embodiments with reference to the appended drawings, in which.

DESCRIPTION OF THE PREFERRED EMBODIMENTS

Figure 1:
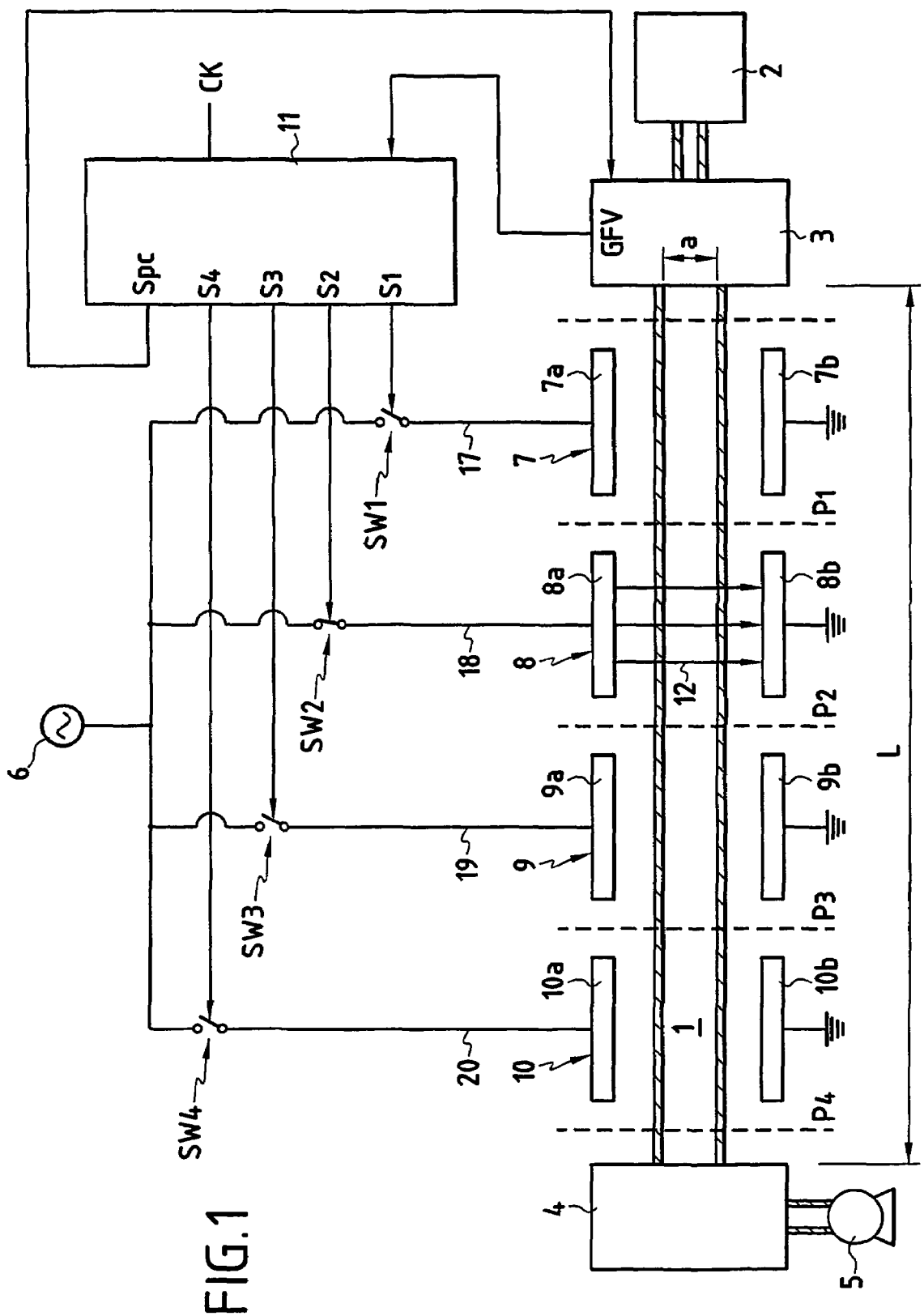
FIG. 1 is a schematic cross-sectional view of an apparatus for plasma treatment according to a first embodiment of the invention.

The method and apparatus for plasma treatment of a non-conductive hollow substrate according to the present invention will be described in relation with a first embodiment illustrated in FIG. 1. A tube 1 having a length L and a diameter a is connected at one extremity to a process gas source 2 through a gas flow controller 3. The process gas supplied from the source 2 contains a precursor, such as acrylic acid, in order to create plasma. The quantity of precursor supplied to the internal cavity of the tube is controlled by the gas flow controller 3 which sets the kinetic of the gas injected in the tube. The opposite extremity of the tube 1 is in communication with a device 4 connected to a vacuum pump 5.

Four ionisation energy sources 7 to 10 are disposed adjacent to each other along the substrate length L. The ionisation energy sources, which will be referred hereinafter as plasma sources, each comprises a first and second electrodes 7a, 7b (respectively 8a, 8b; 9a, 9b; and 10a, 10b) facing each other with the substrate therebetween. The electrodes of each plasma source have dimensions adapted to produce an electric field therebetween covering at least the diameter or the width of the tube.

Although FIG. 1 shows an embodiment comprising a set of four plasma sources, the number of plasma sources is not limited to this value. The apparatus of the present invention may comprise more or less plasma sources depending on the dimensions of the substrate to be treated.

Moreover, according to the present invention, the plasma sources are of a size which ensures generating a uniform electric field while being suitably disposed along the substrate to be treated. The source are controlled by a processing means so that the motion of either the tube or a single source, carried out in the prior art, may be recreated from a set of static plasma sources, thus avoiding the drawbacks of the prior art solutions.

The plasma sources 7 to 10 are connected to a radio frequency (RF) power source 6 through corresponding supply lines 17 to 20. The supply lines 17 to 20 each comprise a switch SW. The switches SW1 to SW4 are independently controlled by a processing device 11 such as a micro controller through corresponding output terminals S1 to S4.

The plasma source can be either a capacitively coupled plasma source or an inductively coupled plasma source. In FIG. 1, for example, the sources illustrated are of a capacitively coupled plasma source type. An electric field 12 is created between the electrodes 8a and 8b of the source 8 by reactance coupling when the electrodes are powered by the RF power supply 6.

The four ionisation plasma sources 7 to 10, which can be a capacitively coupled plasma source or an inductively coupled plasma source, define four plasma creation zones P1 to P4 delimited by the specific electric field produced from each source. Accordingly, the plasma creation can be controlled for each plasma creation zone P1 to P4 through the processing means 11 which controls the open/close state of the switches SW1 to SW4 provided in the supply lines 17 to 20 of the sources 7 to 10. Each plasma source can be powered by a common RF power source or by a separate source.

The plasma is thus created along the tube by the set of sources 7 to 10 sequentially powered. A main advantage of this configuration is the possibility to regulate the "plasma source motion" with required velocity, frequency and direction.

Indeed, since the powering of the source can be independently initiated by the processing means, the velocity of the plasma source motion along the tube 1 is regulated by the frequency at which the switches are sequentially closed. The direction of the plasma source motion is determined by the order according to which the switches are closed under the control of the processing means. Furthermore, in the same way, the frequency of the plasma source motion is determined by the number of times the processing means causes the sources to be powered. In view of this, the velocity, the direction and/or the frequency of the plasma source motion can be set to a fixed or variable value depending on the sequence programmed in the processing means.

According to an implementation of the method plasma treatment of the invention, the process gas is permanently flowed in the substrate at a constant precursor rate while the plasma sources are sequentially powered. In this case, a fixed programmed sequence of source powering may be suitable.

Nevertheless, the sequence of source powering can be programmed in such a way that the frequency, the velocity and/or the direction of the plasma source motion can be controlled according to the process gas flow injected inside the substrate. The process gas flow may be monitored by the processing means 11 which receives a gas flow value signal GFV from the gas flow controller 3. Accordingly, if the process gas is not constantly flowed in the substrate, the processing means is able to correct this irregularity by modulating one or more parameters with regards to the control of the source motion accordingly. This provides means for ensuring the plasma to have a local density uniform all along the substrate.

Alternatively, the plasma creation inside the substrate can be obtained in a pulsed way. In order to do this, the RF power source 6 is of a pulse generator type. The same applies when each plasma source is powered by a separate source which is, in this case, of a pulse generator type.

Furthermore, the gas flow can be also pulsed by the gas flow controller 3. When the process gas containing the precursor is not permanently flowed in the substrate, it must be renewed at least between each powering sequence of the sources in order to maintain a constant precursor concentration in front of the sources when plasma is created. Therefore, if the process gas is supplied in the substrate in a pulsed way, the gas flow controller 3 can be slaved to the powering sequences of the plasma sources so that the injection of the process gas is synchronized with the powering of each plasma source. To this end, the processing means 11 has a control_output terminal Spc through which a control signal is sent to the gas flow controller 3. The output terminal Spc may also be used for commanded the flowing of process gas according to a specific program loaded in the processing means 11.

In view of the above, a pulsed energy source can be implemented with or without a pulsed gas flow while, in the same way, a pulsed gas flow can be implemented with or without pulsed energy source.

The plasma can be also created inside the substrate from sources of an inductively coupled plasma type. In this case, the plasma sources are comprised of two coil arrangements which can be disposed in the vicinity of the substrate substantially in the same configuration as the pair of electrodes illustrated in FIG. 1.

Figure 2:
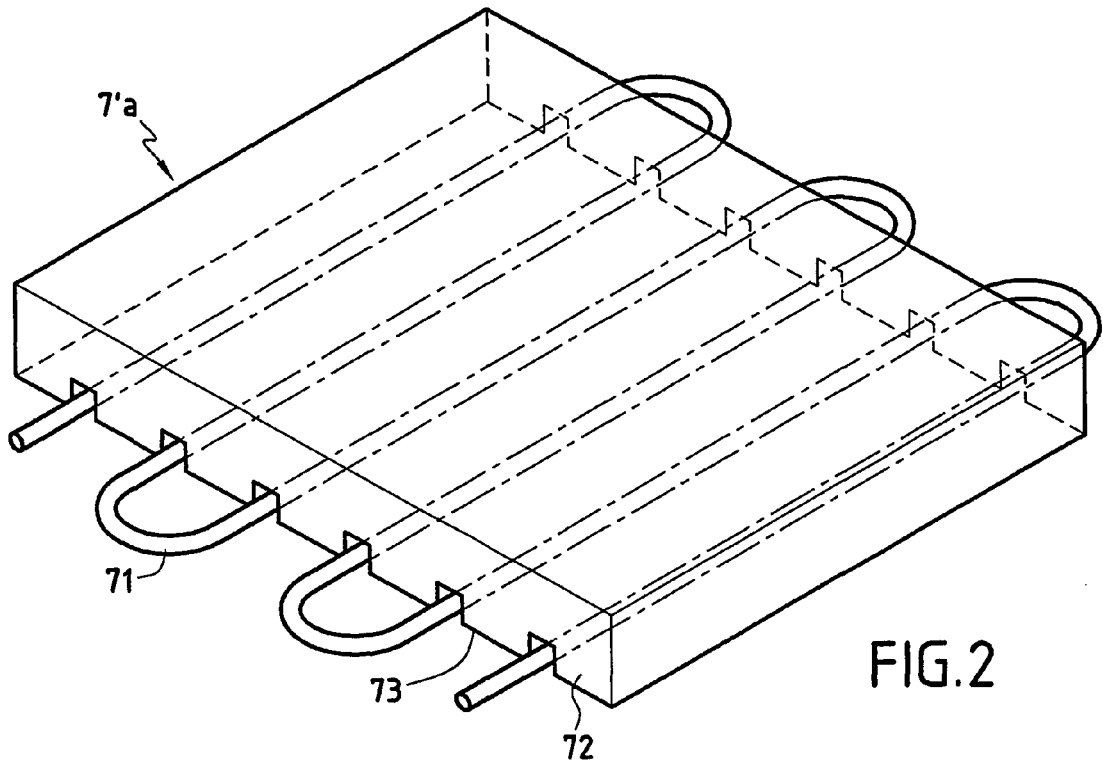
FIG. 2 is schematic perspective view of a coil arrangement according to an embodiment of the invention.

An embodiment of one of two coil arrangements, which are similar, is illustrated in FIG. 2. The arrangement 7a' comprises an inductor 71 disposed according to a serpentine form in such a way that the inductor presents a series of opened linked loops.

In another embodiment, the arrangement can comprise a series of superimposed linked loops formed by a single inductor. Such an arrangement allows the inductive energy produced by the inductor to be increased.

The coil arrangements in the present invention are not limited to the two above examples and a man skilled in the art could obviously imagine various embodiments for the coil arrangement without any difficulties.

The inductor may be associated with a magnetic core in order to increase and homogenize the magnetic field produced by the inductor. This technical aspect of such an association as also its various embodiments have already been described in detail in European Patent Application EP 0 908 923. Referring to FIG. 2, a magnetic core 72 includes a pole face structure 73 to ensure that the magnetic field minimizes the "dead area" at the intervals between the loops formed by the inductor. Accordingly, the combination of the magnetic core and the inductor form a coil arrangement which allows an homogenized magnetic flux all over the area of the substrate which is covered by the source constituted by two coil arrangements. The inductor 71 is comprised in a lower part of the magnetic cores 72 respectively so as to be close to the substrate to be treated. However, according to the nature of the material constituting the magnetic core or the magnetic flux expected, the inductor may be located at different positions in the magnetic core. The magnetic core may be easily matched to the shape and dimensions desired.

With a plasma source comprising two coil arrangements as described above, a transversal magnetic flux, which is substantially perpendicular to a substrate cavity length L, is produced. The coil arrangements are both supplied by a RF power source which generates an electrical current I flowing in the same direction in both inductors of the coil arrangements respectively.

Accordingly, the magnetic flux is produced transversally and perpendicularly to the substrate in a sense determined by the direction of the current flowing in the coils arrangements. As the substrate is non-conductive, the magnetic flux generates an electric field which is produced in the substrate plan perpendicularly to the direction of the magnetic flux.

As the magnetic flux is perpendicular and transverse to the cavity length of the substrate, the electric field circles in a loop all over the substrate plan. Accordingly, the path for accelerating the electrons is longer and an efficient plasma creation can therefore be obtained.

As a result, the electrical flux is created in the whole area covered by the source which ionises the process gas in the corresponding substrate volume. This configuration is particularly suitable for plasma treatment of thin hollow substrates because of its good efficiency criterion which is, for a transversal flux, about R≈0.3, as explained in detail in the European patent application EP 00 400 445 .3.

Moreover, the propagation of the magnetic field is independent of the substrate parts placed in the chamber since they are non-conductive.

Figure 4:
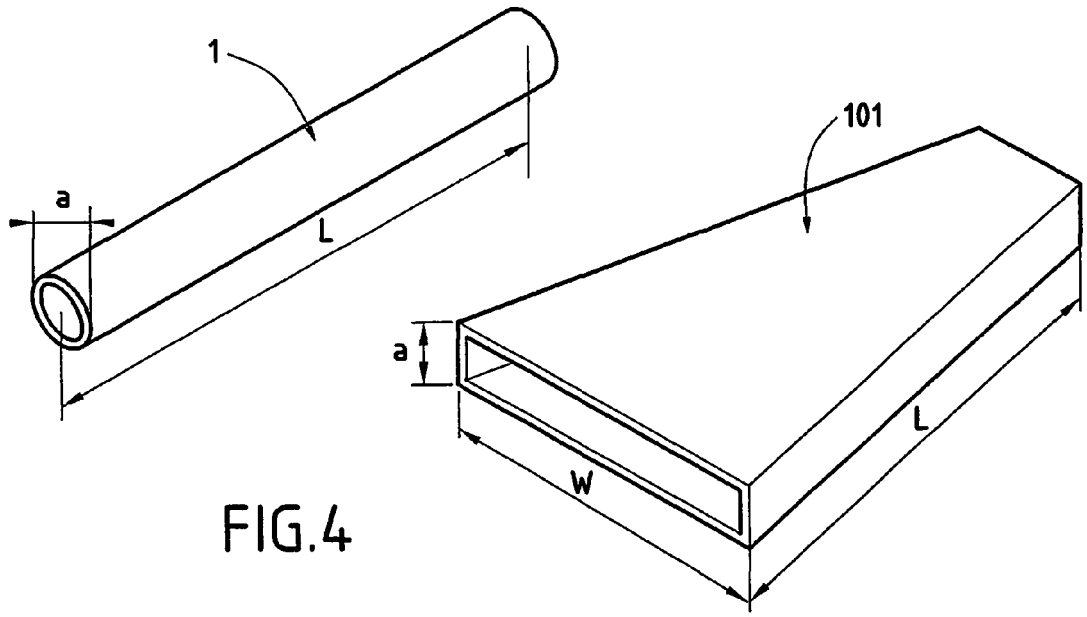
FIG. 4 is a perspective view of two substrates examples.
Figure 3:
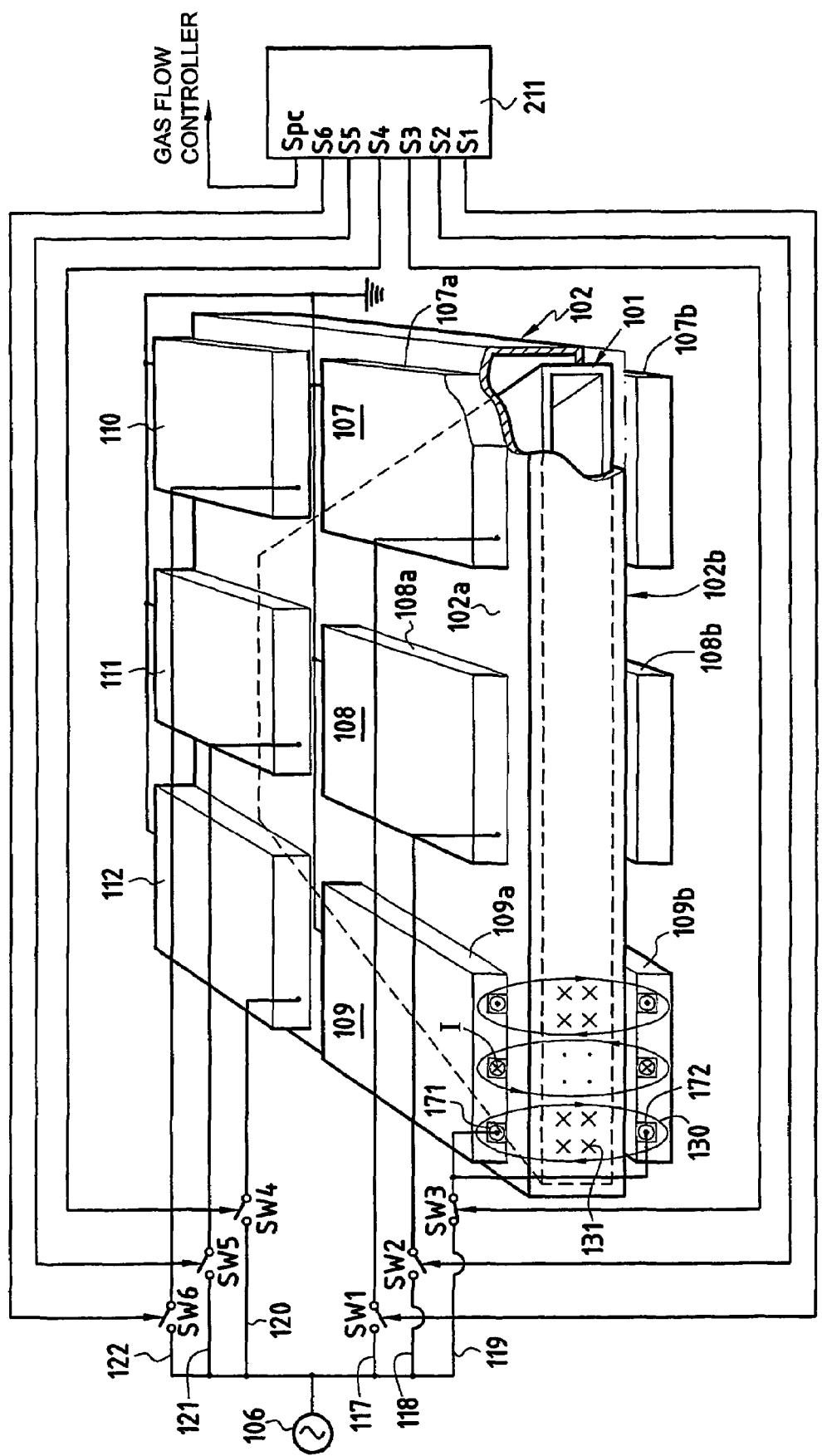
FIG. 3 is schematic perspective view of an apparatus for plasma treatment according to a second embodiment of the invention.
Figure 5:
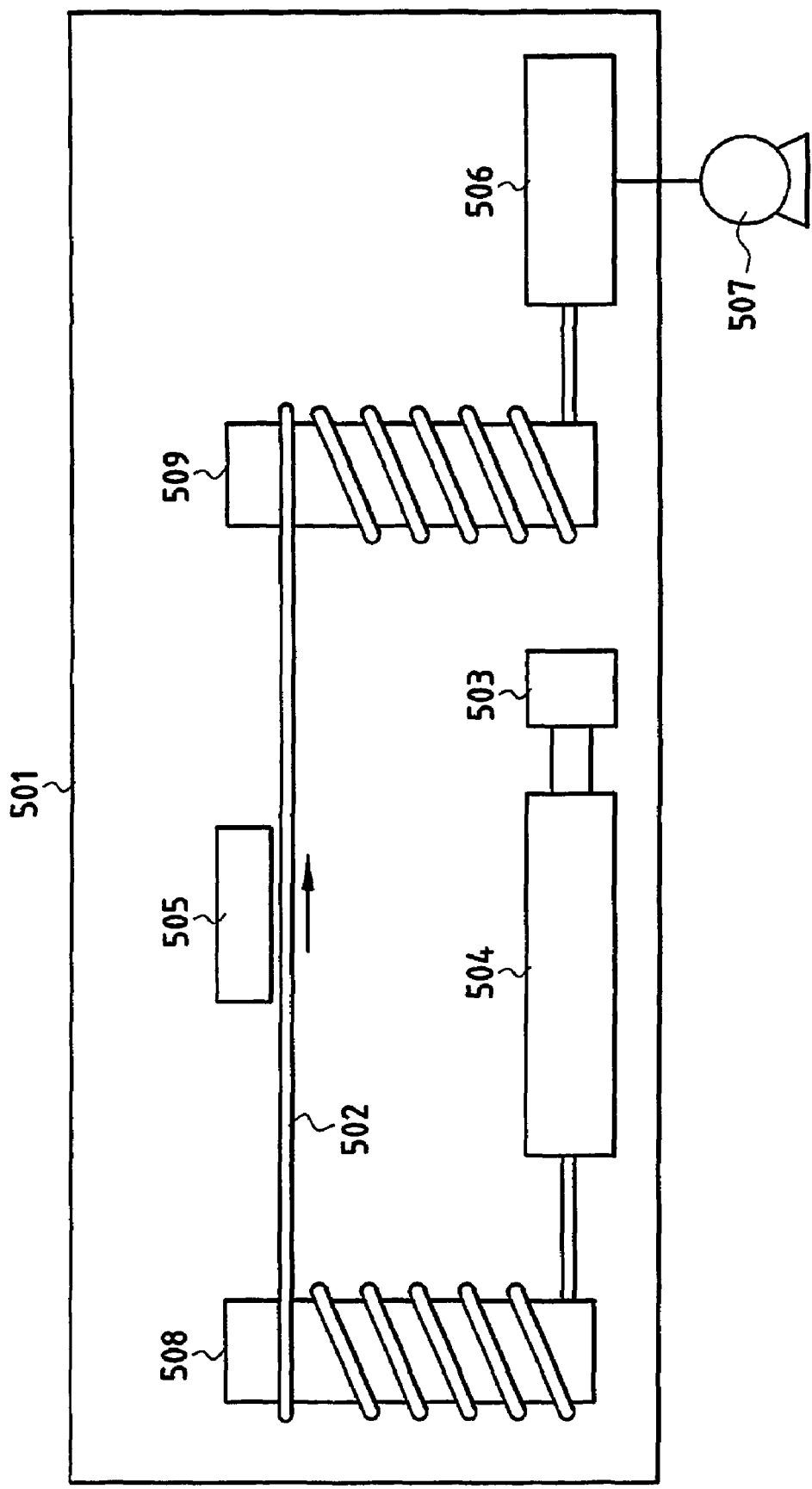
FIG. 5 is a schematic view of a conventional apparatus for plasma substrate treatment.

FIG. 3 illustrates a second embodiment of an apparatus for plasma treatment according to the present invention. In this embodiment, the set of plasma sources is comprised of an array of six plasma sources 107 to 112 disposed according two directions. Indeed, the substrate to be treated is a flat box 101 as that represented in FIG. 4. As can be seen from FIG. 3, three plasma sources 107 to 109 are disposed adjacent to each other according to a first row while the sources 110 to 112 are respectively aligned with the sources 107 to 109 according to a second row. The disposition of the plasma sources 107 to 112 according to an array of two dimensions matches the form of the flat box 101 which, contrary to a tube, presents a width W shown in FIG. 4.

As shown for the plasma source 107, each source comprises two parts 107a and 107b sandwiching the flat box 101 to be treated. The two parts of each source may be reactance electrodes or, as represented in FIG. 3, two coils arrangements having the structure described above.

As illustrated only for plasma source 109 in order to simplify the figure, both coil arrangements 109a and 109b are connected to a RF power source 106 via a switch SW3 which is on/off controlled by the processing means 211 through an output terminal S3. Therefore, both coil arrangements of the plasma sources 107 to 112 are sequentially powered by the source 106 via respective switches SW1 to SW6 which are on/off controlled by the processing means 211 through output terminals S1 to S6 respectively. As for the embodiment of FIG. 1, each plasma source may be also powered by a separate RF power source.

Besides, the coil arrangements of a source are both supplied by a same RF power supply source which generates an electrical current I flowing in the same direction in both inductors 171 and 172 of the coil arrangements 109a, 109b, respectively. The inductors 171 and 172 of the coils arrangements 109a and 109b may also be independently supplied from two separate RF power sources provided that the current in both inductors flows simultaneously in the same direction in order to prevent a magnetic flux induced from an inductor to be canceled by the magnetic flux induced from the other. In this case, the number of controlled switches together with the number of output terminals provided with the processing means 211 will be doubled.

The coil arrangements may be driven at a frequency of around 10 kHz to 100 MHz. For example, the typical operating frequency of 13.56 MHz, delivered by the power supply devices commonly used, is sufficient to treat numerous types of thin hollow substrates with an optimum efficiency.

When a plasma source is powered, a transversal magnetic flux 130, which is substantially perpendicular to a substrate length L is produced by the two coil arrangements of the source. Accordingly, the magnetic flux 130 is produced transversally and perpendicularly to the substrate 101 in a sense determined by the direction of the current flowing in the coils arrangements. As the substrate 101 is non-conductive, the magnetic flux 130 generates an electric field 131 which is produced in the substrate plan perpendicularly to the direction of the magnetic flux 130.

The apparatus comprises a classical plasma chamber 102 in which a plasma processing can be implemented. The chamber 102 includes a sealed area which can be evacuated and controlled in pressure by evacuating means such as those shown in FIG. 1. The chamber is filled with a process gas via a process gas source and a gas flow controller (not shown). As the substrate is included in the sealed area of the chamber 102, the process gas can be ionised inside and/or outside the substrate allowing plasma creation inside and/or outside the substrate.

The plasma chamber further comprises a first and a second field admission windows 102a and 102b made of quartz or other dielectric material such as to allow an energy field to enter inside the chamber by inductive coupling and thereby create or sustain the required plasma processing conditions. The space defined between the two windows substantially corresponds to the thickness dimension of the plasma chamber volume occupied by the flat box 101. The form and the dimensions of the plasma chamber and so the field admission windows depend on the form and the size of the substrate to be treated. For example, the field admission windows have to cover at least the whole widest face of a parallelepipedic hollow substrate or the cylindrical part of a tubular substrate.

As for the first apparatus embodiment described in relation to FIG. 1, the processing means 211 are specifically programmed so as to control sequentially the on/off state of the switches SW1 to SW6, thus determining the direction, the velocity and/or the frequency of the plasma source all over the substrate. The difference with the first embodiment is that the plasma source motion can be controlled with respect to two dimensions. The gas flow inside the substrate may be also slaved to the processing means 211 through the output terminal Spc.

The invention claimed is:

1. A method for plasma treatment of a non-conductive elongated hollow substrate having a length, a transverse dimension transverse to the length and an internal cavity, by an apparatus for plasma treatment including a plurality of ionization energy sources disposed adjacent to each other along said length, each ionization energy source including a first and a second source part that face each other and are dimensioned to produce there between a uniform field covering at least said transverse dimension, said method comprising the steps of:
    a) placing the substrate to be treated in between said first and second source parts of said ionization energy sources;
    b) injecting a process gas inside the cavity of said substrate, said process gas containing a precursor to be consumed for plasma treatment of said substrate; and
    c) maintaining pressure inside the cavity of said substrate within a predetermined range; and
    d) powering from radio frequency power supply means the ionization energy sources sequentially, thus selectively creating plasma inside the cavity of said substrate at a location corresponding to the respective powered ionization energy source, said radio frequency power supply means delivering power at a frequency around 10 kHz to 100 MHz;
    wherein said step b) of injecting the process gas inside the cavity of said substrate is repeated at least before the powering of each ionization energy source to replace consumed precursor so as to maintain a constant precursor concentration each time plasma is created.

2. The method for plasma treatment according to claim 1, wherein said step b) is commanded such that process gas is injected in a pulsed fashion so that the injection of process gas is synchronized with the powering of each of the ionization energy sources.

3. The method for plasma treatment according to claim 1, wherein, in said step b) of injecting a process gas inside the substrate, the process gas is continuously injected inside the substrate at a constant precursor rate.

4. The method for plasma treatment according to claim 1, wherein the plurality of ionization energy sources are capacitively coupled plasma sources, said first and said second source parts of each source respectively being first and second electrodes that face each other and are dimensioned to produce there between the uniform field covering at least said transverse dimension, wherein the uniform field is a uniform electric field.

5. The method for plasma treatment according to claim 1, wherein the plurality of ionization energy sources are inductively coupled plasma sources, said first and said second source parts of each source respectively being first and second coil arrangements that face each other and are dimensioned to produce there between a uniform magnetic field covering at least said transverse dimension.

6. The method for plasma treatment according to claim 1, wherein the ionization energy sources are powered in a pulsed fashion.

7. The method for plasma treatment according to claim 1, wherein the plurality of ionization energy sources are disposed at each side of the substrate according to an array of two dimensions.

8. The method for plasma treatment according to claim 1, wherein in said step d), the plurality of ionization energy sources are powered by a single radio frequency power source.

9. The method for plasma treatment according to claim 1, wherein injecting the gas inside the substrate includes injecting the gas from a first end of the substrate, and wherein evacuation of the inside of the substrate is performed via an opening on a second end of the substrate opposite the first end of the substrate.

10. An apparatus for plasma treatment of a non-conductive elongated hollow substrate having a length, a transverse dimension transverse to the length and an internal cavity, said apparatus comprising:
generation means for generating a plasma inside the cavity of said substrate, said generation means comprising a plurality of ionization energy sources disposed adjacent to each other along said length, each ionization energy source comprising a first and a second source part that face each other and are dimensioned to produce there between a uniform field covering at least said transverse dimension;
radio frequency power supply means delivering power at a frequency around 10 kHz to 100 MHz, each ionization energy source being connected to said power supply means through a corresponding supply line, each supply line comprising a switch;
processing means connected to each said switch for sequentially powering the plurality of ionization energy sources from radio frequency power supply means and for selectively creating plasma inside the cavity of said substrate at a location corresponding to the respective powered ionization energy source;
a process gas source for supplying a process gas containing a precursor to be consumed for plasma treatment of said substrate;
a gas flow controller connected to said processing means in order to command a flow of process gas flowing from said process gas source into the cavity of said substrate;
said processing means being programmed to control said switches and said gas flow controller so that said ionization energy sources are sequentially powered and process gas is injected inside the cavity of said substrate at least before the powering of each ionization energy source to replace consumed precursor so as to maintain a constant precursor concentration each time plasma is created.

11. The apparatus according to claim 10, wherein the radio frequency power supply means is of a pulse generator type for powering the ionization energy sources in a pulsed fashion.

12. The apparatus according to claim 10, said processing means being programmed for commanding said gas flow controller for injecting process gas in a pulsed fashion so that the injection of process gas is synchronized with the powering of each ionization energy source.

13. The apparatus according to claim 10, wherein the plurality of ionization energy sources are capacitively coupled plasma sources, said first and said second source parts of each source respectively being first and second electrodes that face each other and are dimensioned to produce there between a uniform electric field covering at least said transverse dimension.

14. The apparatus according to claim 10, wherein the plurality of ionization energy sources are inductively coupled plasma sources, said first and said second source parts of each source respectively being first and second coil arrangements that face each other and are dimensioned to produce there between a uniform magnetic field covering at least said transverse dimension.

15. The apparatus according to claim 14, wherein each of said first and second coil arrangements comprises a combination of a magnetic core and an inductor for producing through the substrate a homogenized magnetic flux perpendicular to a direction of a substrate length all over the area of the substrate which is covered by said first and second coil arrangement.

16. The apparatus according to claim 15, further comprising a plasma chamber provided with two oppositely facing electromagnetic field admission windows made of dielectric material said first and second coil arrangements being oppositely located on an outer surface of the first and second windows respectively, said first and second coil arrangements being connected to a power supply line such that a current of a same direction flows simultaneously in the first and second coil arrangements.

17. The apparatus according to claim 16, wherein said first and second coil arrangements each comprise an inductor having a serpentine form.

18. The apparatus according to claim 16, wherein said plurality of ionization energy sources are disposed at each side of the substrate according to an array of two dimensions.

19. The apparatus according to claim 10, wherein said radio frequency power supply means comprise a single radio frequency power source for powering said plurality of ionization energy sources.

20. The apparatus according to claim 10, wherein said processing means receives a gas flow value signal from said gas flow controller to monitor process gas flow and said processing means is programmed to correct for process gas flow irregularity by modulating one or more parameters of powering said ionization energy sources.

* * * * *

UNITED STATES PATENT AND TRADEMARK OFFICE
CERTIFICATE OF CORRECTION

PATENT NO.       : 7,618,686 B2                                                                 Page 1 of 1
APPLICATION NO.  : 10/475512
DATED            : November 17, 2009
INVENTOR(S)      : Colpo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1075 days.

Signed and Sealed this

Twenty-sixth Day of October, 2010

David J. Kappos
*Director of the United States Patent and Trademark Office*